(12) United States Patent
Okita et al.

(10) Patent No.: US 9,137,468 B2
(45) Date of Patent: Sep. 15, 2015

(54) IMAGE PICKUP APPARATUS

(71) Applicant: CANON KABUSHIKI KAISHA, Tokyo (JP)

(72) Inventors: Akira Okita, Yamato (JP); Yu Arishima, Yokohama (JP); Yasuharu Ota, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/272,279

(22) Filed: May 7, 2014

(65) Prior Publication Data
US 2014/0333817 A1    Nov. 13, 2014

(30) Foreign Application Priority Data
May 10, 2013   (JP) ................. 2013-100249

(51) Int. Cl.
H04N 5/217    (2011.01)
H04N 5/335    (2011.01)
H04N 5/374    (2011.01)
H01L 27/146   (2006.01)
H04N 5/376    (2011.01)
H04N 5/357    (2011.01)
H04N 5/369    (2011.01)
H04N 5/3745   (2011.01)

(52) U.S. Cl.
CPC .......... H04N 5/374 (2013.01); H01L 27/14641 (2013.01); H04N 5/376 (2013.01); H04N 5/3577 (2013.01); H04N 5/3696 (2013.01); H04N 5/37457 (2013.01)

(58) Field of Classification Search
None
See application file for complete search history.

(56) References Cited

U.S. PATENT DOCUMENTS

2001/0030701 A1* 10/2001 Hiyama et al. ................ 348/304
2009/0073279 A1*  3/2009 Ui ............................... 348/222.1

FOREIGN PATENT DOCUMENTS

JP    2003-244712 A    8/2003

* cited by examiner

Primary Examiner — Aung S Moe
Assistant Examiner — Euel Cowan
(74) Attorney, Agent, or Firm — Canon USA, Inc. IP Division

(57) ABSTRACT

An output impedance of a drive unit configured to drive a drive line is set to be varied during a period in which a drive pulse for setting each transfer transistor to be in a conductive state is supplied and during a period in which a drive pulse for setting each transfer transistor to be in a non-conductive state is supplied.

20 Claims, 10 Drawing Sheets

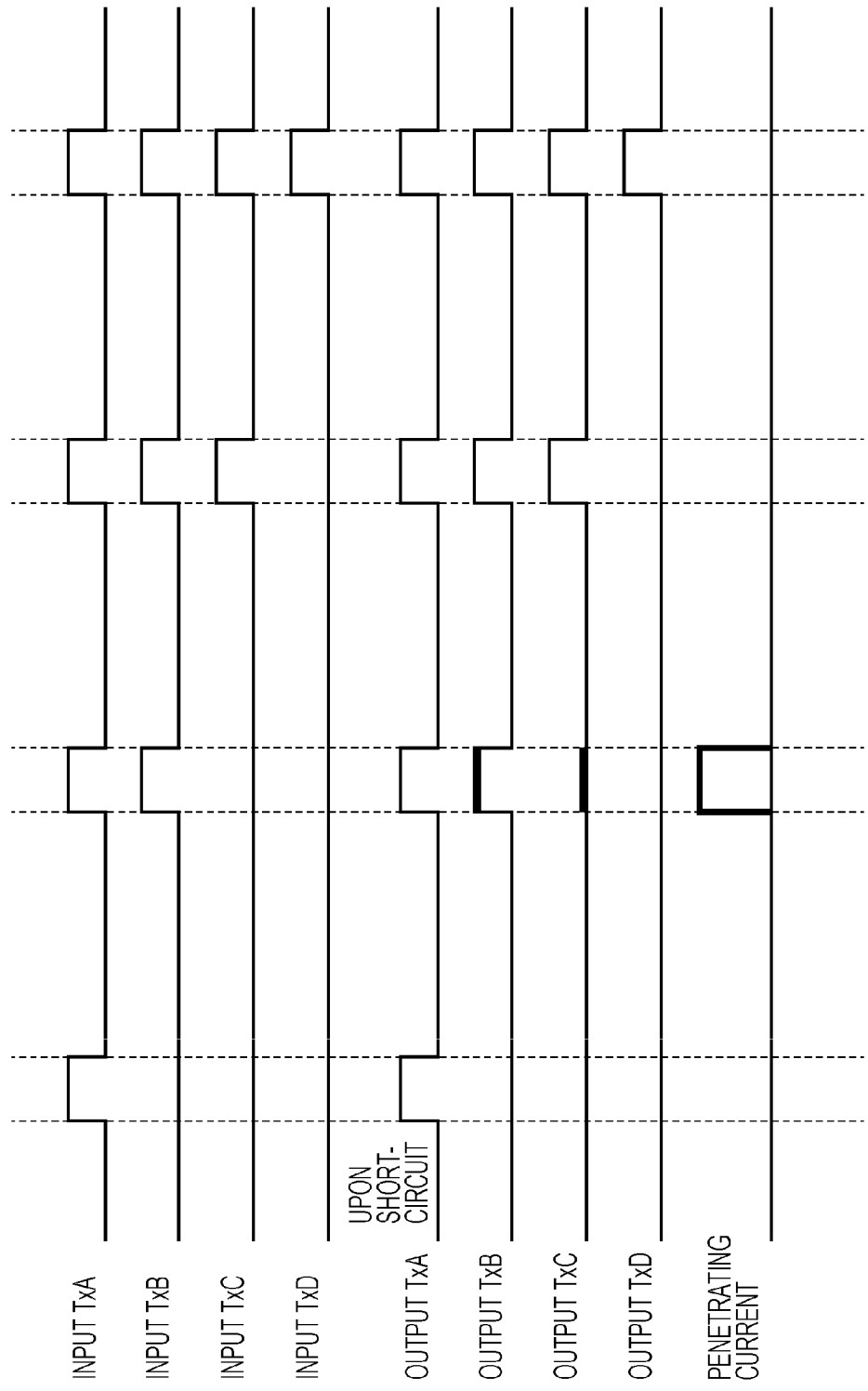

IMAGE PICKUP APPARATUS

BACKGROUND OF THE INVENTION

1. Field of the Invention

One disclosed aspect of the embodiments relates to an image pickup apparatus.

2. Description of the Related Art

In recent years, a development of an image pickup apparatus has been remarkable. An apparatus configured to perform a focus detection in a pupil division system by using an image sensor in which micro lenses are formed on respective pixels of the image pickup apparatus is disclosed (Japanese Patent Laid-Open No. 2003-244712, which will be hereinafter referred to as Patent Document 1).

According to Patent Document 1, the image pickup apparatus is arranged on an expected imaging surface of a taking lens. A single pixel of the image pickup apparatus is constituted by a light receiving portion A and a light receiving portion B, and the respective light receiving portions are arranged so as to be substantially conjugated with a pupil of the taking lens by the micro lenses of the image pickup apparatus formed on a taking lens side.

At the time of the focus detection, signals are independently read out from each of photoelectric conversion units A and B of a plurality of pixels, and two images based on light beams that have transmitted at mutually different locations of the pupil of the taking lens are accordingly generated. Image information can be obtained by adding the two photoelectric conversion units A and B to each other.

However, according to Patent Document 1, since the signals of the photoelectric conversion units A and B are respectively independently read out, transfer transistors configured to perform the readout corresponding to the number of pupil divisions and drive lines for driving switches thereof are prepared. When the numbers of these transfer transistors and drive lines are increased, short-circuit between the drive lines may more easily be caused. More consideration is to be taken with regard to an image quality in a case where these drive lines are mutually short-circuited. Alternatively, in a case where the drive lines are laid out while securing a distance between the drive lines so as not to cause such short-circuit, it is difficult to achieve a miniaturization in a chip area.

SUMMARY OF THE INVENTION

In view of the above-described problems, according to an aspect of the present invention, an image pickup apparatus includes: a plurality of photoelectric conversion units including a first photoelectric conversion unit and a second photoelectric conversion unit adjacent to the first photoelectric conversion unit; a first transfer transistor configured to transfer charge of the first photoelectric conversion unit; a second transfer transistor configured to transfer charge of the second photoelectric conversion unit; a first drive line that supplies a drive pulse to the first transfer transistor; a second drive line that supplies a drive pulse to the second transfer transistor; a first drive unit configured to drive the first drive line; and a second drive unit configured to drive the second drive line, in which an output impedance of the second drive unit during a period in which the first drive unit supplies the first transfer transistor with a drive pulse for setting the first transfer transistor to be in a conductive state and also the second drive unit supplies the second transfer transistor with a drive pulse for setting the second transfer transistor to be in a non-conductive state is higher than an output impedance of the second drive unit during a period in which the first drive line supplies the first transfer transistor with the drive pulse for setting the first transfer transistor to be in the conductive state and also the second drive line supplies the second transfer transistor with a drive pulse for setting the second transfer transistor to be in the conductive state.

Further features of the present invention will become apparent from the following description of exemplary embodiments with reference to the attached drawings.

BRIEF DESCRIPTION OF THE DRAWINGS

FIG. 10 illustrates an example of a drive pulse chart of the image pickup apparatus according to the fourth exemplary embodiment.

DESCRIPTION OF THE EMBODIMENTS

An exemplary embodiment mode of the disclosure will be described by using the drawings. One disclosed feature of the embodiments may be described as a process which is usually depicted as a timing chart or timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions. In the following explanation, an example in which a transistor of a pixel is constituted by an NMOS transistor will be described. In a case where the transistor of the pixel is constituted by a PMOS transistor, polarities of voltages may all be inverted.

Figure 1A:
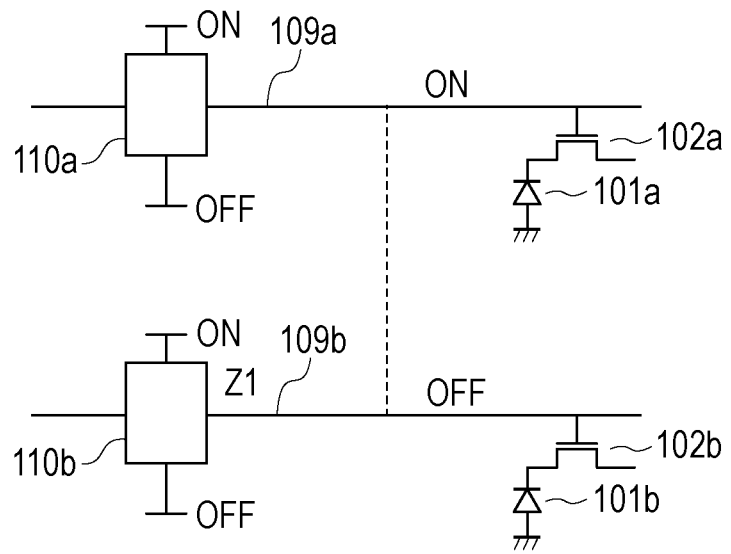
FIGS. 1A and 1B are schematic diagrams according to an exemplary embodiment mode.
Figure 1B:
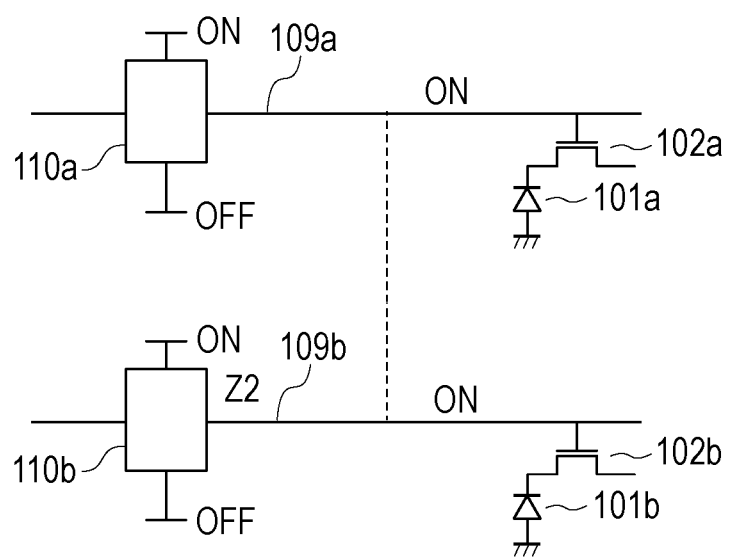

One disclosed aspect of the embodiments has a characteristic in a configuration of drive units configured to supply drive pulses to the respective transfer transistors. FIGS. 1A and 1B are explanatory diagrams for describing the exemplary embodiment.

As the characteristic configuration, output impedances of the drive units are varied during a period in which drive pulses for setting the respective transfer transistors in a conductive state are supplied and during a period in which drive pulses for setting the respective transfer transistors in a non-conductive state are supplied.

The present exemplary embodiment mode will be described by using FIGS. 1A and 1B.

A first photoelectric conversion unit 101a and a second photoelectric conversion unit 101b respectively convert incident lights into charges. The second photoelectric conversion unit 101b is arranged so as to be adjacent to the first photoelectric conversion unit 101a. A first transfer transistor 102a and a second transfer transistor 102b respectively transfer the charges of the first photoelectric conversion unit 101a the second photoelectric conversion unit 101b.

A first drive line 109a and a second drive line 109b supply the drive pulses to the first transfer transistor 102a and the second transfer transistor 102b. Main parts of the first drive line 109a and the second drive line 109b include, for example, parts arranged to be adjacent to each other on a same line layer.

A first drive unit 110a and a second drive unit 110b drive the first drive line 109a and the second drive line 109b.

FIG. 1A illustrates a period in which the first drive unit 110a supplies the drive pulse to the first transfer transistor 102a to establish the conductive state, and the second drive unit 110b supplies the drive pulse to the second transfer transistor 102b to establish the non-conductive state.

FIG. 1B illustrates a period in which the first drive unit 110a supplies the drive pulse to the first transfer transistor 102a to establish the conductive state, and the second drive unit 110b supplies the drive pulse to the second transfer transistor 102b to establish the conductive state.

The output impedance of the second drive unit 110b in FIG. 1A is set as Z1, and the output impedance of the second drive unit 110b in FIG. 1B is set as Z2. According to the present exemplary embodiment mode, it is characterized in that Z1>Z2 is established.

With the above-described configuration, it is possible to arrange the first drive line 109a and the second drive line 109b in close proximity to each other. Alternatively, if the first drive line 109a and the second drive line 109b are short-circuited, a current value flowing via a short-circuit location illustrated by dotted lines in FIGS. 1A and 1B can be set to be small.

Hereinafter, a reason why the current value flowing via the short-circuit location can be set to be small will be described.

In FIG. 1A, a difference between a potential at the first drive line 109a and a potential at the second drive line 109b is generated. If the first drive line 109a and the second drive line 109b are short-circuited, a current based on this potential difference may flow. The current flowing at this time may be influenced by the output impedance of the second drive unit 110b. To elaborate, when the output impedance is high, the flow current is small, and when the output impedance is low, the current is large relatively. Herein, if the output impedance of the second drive unit 110b is regularly set to be high, for example, it may take long time to shift a state in which the potential at the second drive line 109b is low to a state in which the potential is higher than the above-described state.

Therefore, the output impedance Z1 of the second drive unit 110b in FIG. 1A is set to be higher than the output impedance Z2 of the second drive unit 110b in FIG. 1B. According to this, without increasing the time to actually set the potential at the drive line as a desired potential, the current value that may flow in the supposed case of the short-circuit can be set to be small. Alternatively, without increasing the time to actually set the potential at the drive line as the desired potential, a shortest distance between the first drive line 109a and the second drive line 109b can be decreased.

Hereinafter, the disclosure will be described by way of specific exemplary embodiments. The respective exemplary embodiments are examples for carrying out the disclosure and modifications, combination, and the like can appropriately be made within a range of the concept of the disclosure.

First Exemplary Embodiment

An image pickup apparatus according to the present exemplary embodiment will be described by using FIG. 2. Pixel units 100A to 100D include a plurality of photoelectric conversion units. Photo diodes can be used as the photoelectric conversion units, and the pixel unit 100A includes photodiodes 101a and 101b. These photodiodes may respectively function as the first photoelectric conversion unit 101a and the second photoelectric conversion unit 101b.

The first transfer transistor 102a and the second transfer transistor 102b transfer the charges corresponding to the photoelectric conversion units.

Furthermore, each of the pixel units 100A to 100D may include a floating diffusion (FD) region 103, an amplification element 104, a reset transistor 105, and a selection transistor 106.

The amplification element 104 can be constituted by an MOS transistor. The FD region 103 is electrically connected to a gate of the MOS transistor that constitutes the amplification element 104. The FD region 103 may be constituted by a common semiconductor region provided to a single active region with respect to the plurality of photoelectric conversion units or may also be constituted by a plurality of semiconductor regions provided to an independent active region for each of the respective photoelectric conversion units. In the latter case, the plurality of semiconductor regions may electrically be connected to each other by using conductors.

The amplification element 104 may be commonly provided to the plurality of photoelectric conversion units. The first transfer transistor 102a transfers the charge of the first photoelectric conversion unit 101a to the amplification element 104, and the second transfer transistor 102b transfers the charge of the second photoelectric conversion unit 101b to the amplification element 104.

Although not illustrated in the drawing, the light focused by the single micro lens may enter the plurality of photoelectric conversion units provided in the respective pixel units. With the above-described configuration, it is possible to perform a focus detection operation on an image pickup surface.

The MOS transistor constituting the amplification element 104 constitutes a part of a source follower amplifier and may output a signal in accordance with the amount of the charge transferred to the FD region 103. In a case where the amplification element 104 is constituted by the MOS transistor, the gate serves as an input node of the source follower amplifier. A voltage of the FD region 103 is reset by the reset transistor 105.

According to the present exemplary embodiment, drain voltages at the MOS transistor constituting the amplification element 104 and the reset transistor 105 are set as a common power supply voltage SVDD. The selection transistor 106 selects a row where an output is performed.

A signal of the pixel unit 100A is read out to a vertical signal line 107. A current source 108 is electrically connected to the vertical signal line 107. The current source 108 supplies a bias current to the MOS transistor constituting the amplification element 104. The respective vertical signal lines 107 are electrically connected to a readout circuit provided for each column. A noise removal circuit, an amplification circuit, an analog-digital conversion circuit can be provided in the readout circuit.

The first drive line 109a and the second drive line 109b are respectively connected to gates of the first transfer transistor 102a and the second transfer transistor 102b in the pixel unit 100A. Similarly, respective drive lines (not illustrated) are connected to gates of the reset transistor 105 and the selection transistor 106.

The first drive line 109a and the second drive line 109b are respectively electrically connected to the first drive unit 110a, the second drive unit 110b. Main parts of the first drive line 109a and the second drive line 109b are, for example, constituted on a same line layer and include parts arranged to be adjacent to each other. The first drive unit 110a and the second drive unit 110b are respectively connected to a first buffer 111a and a second buffer 111b to which a control pulse TxA and a control pulse TxB are respectively input. The first buffer 111a and the second buffer 111b can be constituted, for example, by inverters.

The first drive unit 110a includes a PMOS transistor 112a (first switch) and an NMOS transistor 113a (second switch). Furthermore, the first drive unit 110a includes an NMOS transistor 114a (sixth switch) having a driving performance n times (n>0) as large as a driving performance of the NMOS transistor 113a. The NMOS transistor 114a is arranged so as to be connected to the NMOS transistor 113a in parallel. Alternatively, a single NMOS transistor can also be divided to realize the configuration. A gate corresponding to a control node of the NMOS transistor 113a and a gate corresponding to a control node of the NMOS transistor 114a are a common node. Therefore, operations of the NMOS transistor 113a and the NMOS transistor 114a are controlled by a common control pulse.

The second drive unit 110b includes a PMOS transistor 112b (fifth switch) and an NMOS transistor 113b (fourth switch). Furthermore, the second drive unit 110b includes an NMOS transistor 114b (third switch) having a driving performance n times as large as a driving performance of the NMOS transistor 113b. The NMOS transistor 114b is arranged so as to be connected to the NMOS transistor 113b in parallel.

Control nodes of the PMOS transistor 112a, the NMOS transistor 113a, the NMOS transistor 114a, and the NMOS transistor 114b are a common node (first common node), and this common node is supplied with an inverted pulse of the control pulse TxA.

Control nodes of the PMOS transistor 112b and the NMOS transistor 113b are a common node (second common node), and this common node is supplied with an inverted pulse of the control pulse TxB. The first common node and the second common node may be nodes that can electrically be separated from each other. According to the present exemplary embodiment, the first common node and the second common node are nodes mutually electrically insulated from each other. Therefore, the gate corresponding to the control node of the NMOS transistor 114b and the gate corresponding to the control node of the NMOS transistor 113b are nodes electrically separated from each other. To elaborate, each of the first common node and the second common node can receive an independent control pulse.

A source of the PMOS transistor 112a is supplied with a voltage (VDD) for setting the first transfer transistor 102a to be in the conductive state. A source of the PMOS transistor 112b is supplied with a voltage (VDD) for setting the second transfer transistor 102b to be in the conductive state. The PMOS transistor 112a supplies a voltage corresponding to the drive pulse for setting the first transfer transistor 102a to be in the conductive state. Similarly, the PMOS transistor 112b supplies a voltage corresponding to the drive pulse for setting the second transfer transistor 102b to be in the conductive state. A drain of the PMOS transistor 112a and a drain of the PMOS transistor 112b are respectively electrically connected to the first drive line 109a and the second drive line 109b.

Sources of the NMOS transistors 113a, 113b, 114a, and 114b are supplied with a voltage for setting the first transfer transistor 102a or the second transfer transistor 102b to be in the non-conductive state. The NMOS transistor 113a supplies a voltage corresponding to the drive pulse for setting the first transfer transistor 102a to be in the non-conductive state. The NMOS transistor 113b supplies a voltage corresponding to the drive pulse for setting the second transfer transistor 102b to be in the non-conductive state. The NMOS transistor 114a supplies a voltage corresponding to the drive pulse for setting the first transfer transistor 102a to be in the non-conductive state. The NMOS transistor 114b supplies a voltage corresponding to the drive pulse for setting the second transfer transistor 102b to be in the non-conductive state. Herein, the first and second transfer transistors 102a and 102b are NMOS transistors, and the voltage for establishing the non-conductive state may preferably be a ground potential or a negative potential.

An output node 120a of the first buffer 111a to which the control pulse TxA is input is connected to gates of the PMOS transistor 112a and the NMOS transistor 113a. An output node 120b of the second buffer 111b to which the control pulse TxB is input is connected to gates of the PMOS transistor 112b and the NMOS transistor 113b. The output node 120b is not connected to gates of the PMOS transistor 112a, the NMOS transistor 113a, the NMOS transistor 114a, and the NMOS transistor 114b. To elaborate, the output node 120b is an electrically separated node.

Figure 3:
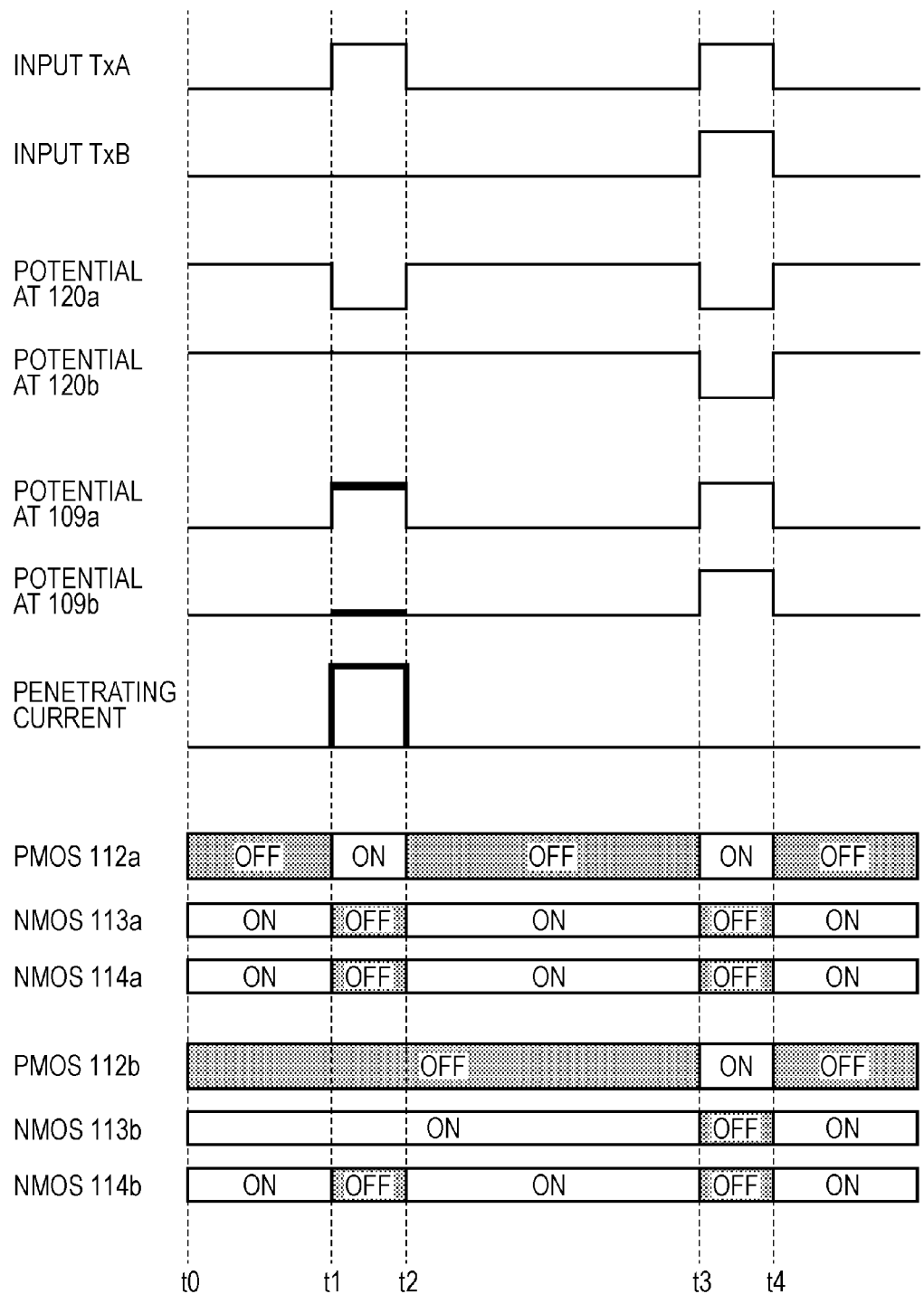
FIG. 3 illustrates an example of a drive pulse chart of the image pickup apparatus according to the first exemplary embodiment.

An example of a drive pulse, or a timing chart for a drive pulse, of the image pickup apparatus according to the present exemplary embodiment will be described by using FIG. 3.

A potential at the FD region 103 is reset by the reset transistor 105 at a time t0. The selection transistor 106 is in the conductive state (ON). For that reason, a signal based on the potential at the FD region 103 corresponding to an input node of the amplification element 104 is output to the vertical signal line 107 as a noise signal of the pixel. This period corresponds to the non-conductive state (OFF) for the PMOS transistors 112a and 112b and the conductive state (ON) for the NMOS transistors 113a, 114a, 113b, and 114b. According to this, the first drive line 109a and the second drive line 109b supply the drive pulse for turning OFF the first transfer transistor 102a and the second transfer transistor 102b.

The control pulse TxA is transited to ON at a time t1. According to this, the PMOS transistor 112a is transited from OFF to ON, and the NMOS transistors 113a, 114a, and 114b are transited from ON to OFF. A potential at the first drive line 109a is transited to a drive pulse at a level for turning ON the first transfer transistor 102a. Subsequently, the charge of the photodiode 101a is transferred to the FD region 103. At this time, the control pulse TxB remains OFF. Since the gate of the NMOS transistor 114b is supplied with the control pulse TxA, the NMOS transistor 114b is transited from ON to OFF. However, the potential at the second drive line 109b is set at a level at which the second transfer transistor 102b is turned OFF by the NMOS transistor 113b.

The control pulse TxA is transited from ON to OFF at a time t2. At this time, the respective drive pulses are in the same state as the state at the time t0. Subsequently, a potential at the FD region 103 changes by the voltage equivalent to the charge read out from the photodiode 101a at the time t1. The output is read out to the readout circuit via the vertical signal line 107.

In order that the drive pulse supplied by the first drive line 109a is transited from ON to OFF, the potential at the first drive line 109a is to be decreased. For this reason, the sizes of the NMOS transistors 113a and 114a are determined by the driving performance used for a statically determinate state within a desired time when the control pulse TxA is turned OFF. Herein, as an example of a parameter contributed to the driving performance of the MOS transistor, when a channel length of the MOS transistor is set as L and a channel width is set as W, W/L may appropriately be changed. If the driving performance is desired to be increased, a value of W/L may be increased. Hereinafter, W/L of the MOS transistor may be described as the size in some cases.

As this driving performance is larger, it is possible to establish the statically determinate state in a shorter time. The driving performance of the NMOS transistor 114a is set as n times as large as the driving performance of the NMOS transistor 113a. Since the NMOS transistors 114a and 114b are connected in parallel, as compared with a case where the drive is carried out by only the NMOS transistor 114a, the potential at the drive line can be put in the statically determinate state by the (1+n)-fold driving performance. Specifically, a channel length of the NMOS transistor 114b constituting the third switch is set as L1, and a channel width is set as W1. Subsequently, a channel length of the NMOS transistor 113b constituting the fourth switch is set as L2, and a channel width is set as W2. At this time, the following condition may be satisfied.

$$W1/L1 > W2/L2$$

The control pulses TxA and TxB are transited to ON at a time t3. The PMOS transistors 112a and 112b are transited from OFF to ON, and the NMOS transistors 113a, 114a, 113b, and 114b are transited from ON to OFF. According to this, the potential at the first drive line 109a and the potential at the second drive line 109b are shifted to the drive pulses at the level for turning ON the respective transfer transistors. According to this, the charges of the photodiodes 101a and 101b are transferred to the FD region 103. With this operation, the charges of the photodiodes 101a and 101b are added in the FD region 103.

The charge of the photodiode 101a has been transferred once at the time t1, but the transfer is performed again. According to this, the charges generated in the photodiodes 101a and 101b are added in the FD region 103, and it is possible to uniform accumulation times and accumulation periods in the photodiodes 101a and 101b to each other. With this operation, the obtained signal can be used for an image pickup operation.

The control pulses TxA and TxB are transited to OFF at a time t4. At this time, the respective drive pulses are in the same state as that at the time t2, and the potential at the FD region 103 is changed by the voltage equivalent to the charges transferred from the photodiodes 101a and 101b at the time t3. The signal is read out to the readout circuit via the vertical signal line 107.

The signal read out to the readout circuit based on the charge generated in the photodiode 101a can be obtained on the basis of a difference between the signal read out to the readout circuit at the time t0 and the signal read out to the readout circuit at the time t2. The signal based on the charges generated in the photodiodes 101a and 101b can be obtained on the basis of a difference between the signal read out to the readout circuit at the time t0 and the signal read out to the readout circuit at the time t4.

According to the present exemplary embodiment, it is possible to decrease the current that flows when the first drive line 109a and the second drive line 109b are short-circuited as indicated by a dotted line 130 in the drawing.

If such short-circuit is caused, since the potential at the first drive line 109a is the same as the potential at the second drive line 109b at the time t0, the current hardly flows.

At the time t1, the first drive line 109a has an output (VDD) at a level for turning ON the first transfer transistor 102a, and on the other hand, the second drive line 109b has an output (GND) at a level for turning OFF the second transfer transistor. Since a potential difference is generated between the potential at the first drive line 109a and the potential at the second drive line 109b, a short-circuit current may flow.

A current path at that time is Path 1 as follows.
The VDD→the PMOS transistor 112a→the first drive line 109a→the short-circuit location 130→the second drive line 109b→the NMOS transistor 113b→the GND.

Figure 4:
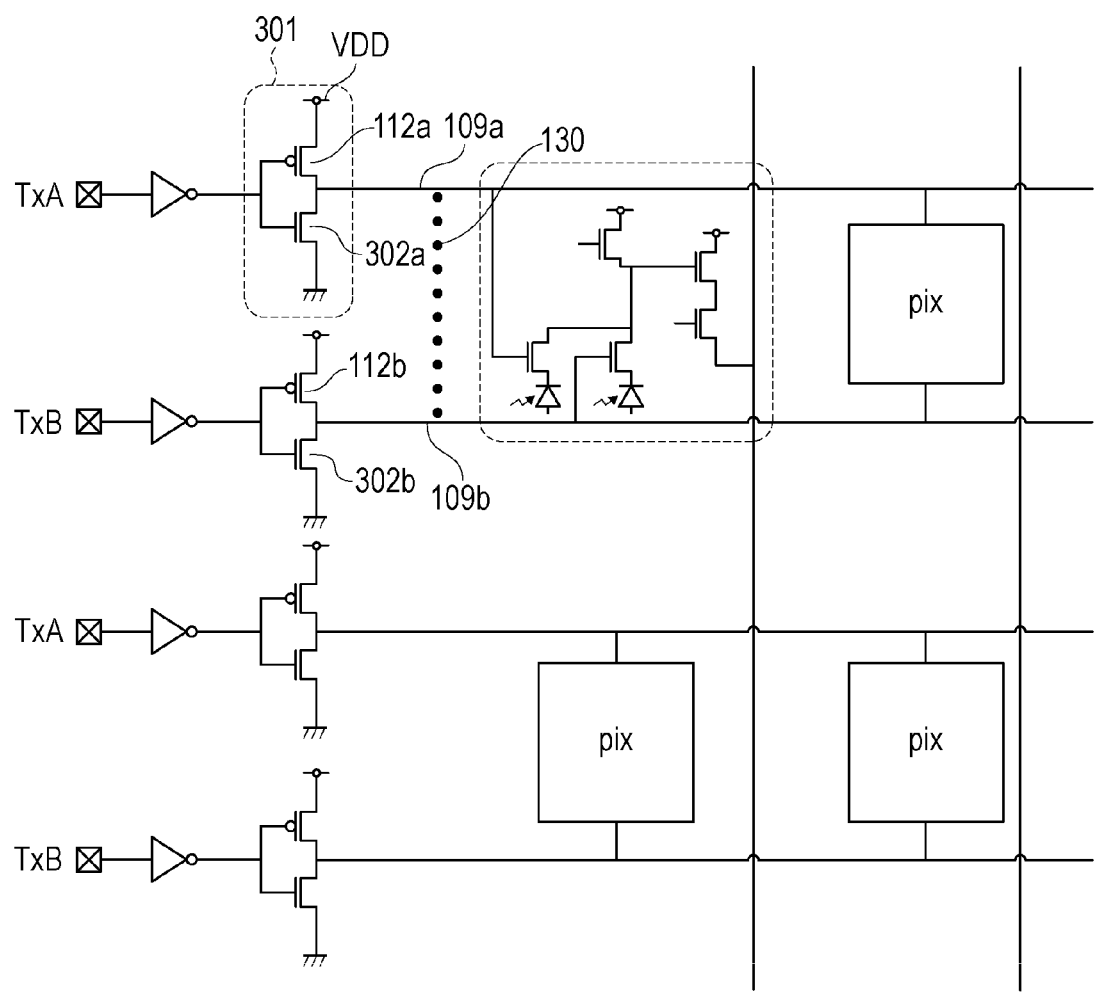
FIG. 4 is a schematic diagram of the image pickup apparatus according to a reference example.

Herein, FIG. 4 illustrates a reference example for understanding the present exemplary embodiment. In FIG. 4, an inverter 301 includes a PMOS transistor 112 arranged on the power supply voltage VDD side and an NMOS transistor 302 arranged on the ground side. In a case where the first transfer transistor is in the conductive state and the second transfer transistor is in the non-conductive state, a state may exist in which the first drive line 109a has a high potential, and the second drive line 109b has a potential lower than the above-described potential. As illustrated in FIG. 4, in the case of the inverter 301 constituted by the single NMOS transistor 302 and the single PMOS transistor 112, a current path upon short-circuit is Path 2 as follows.

The VDD→the PMOS transistor 112a→the first drive line 109a→the short-circuit location 130→the second drive line 109b→the NMOS transistor 302b→the GND.

Figure 2:
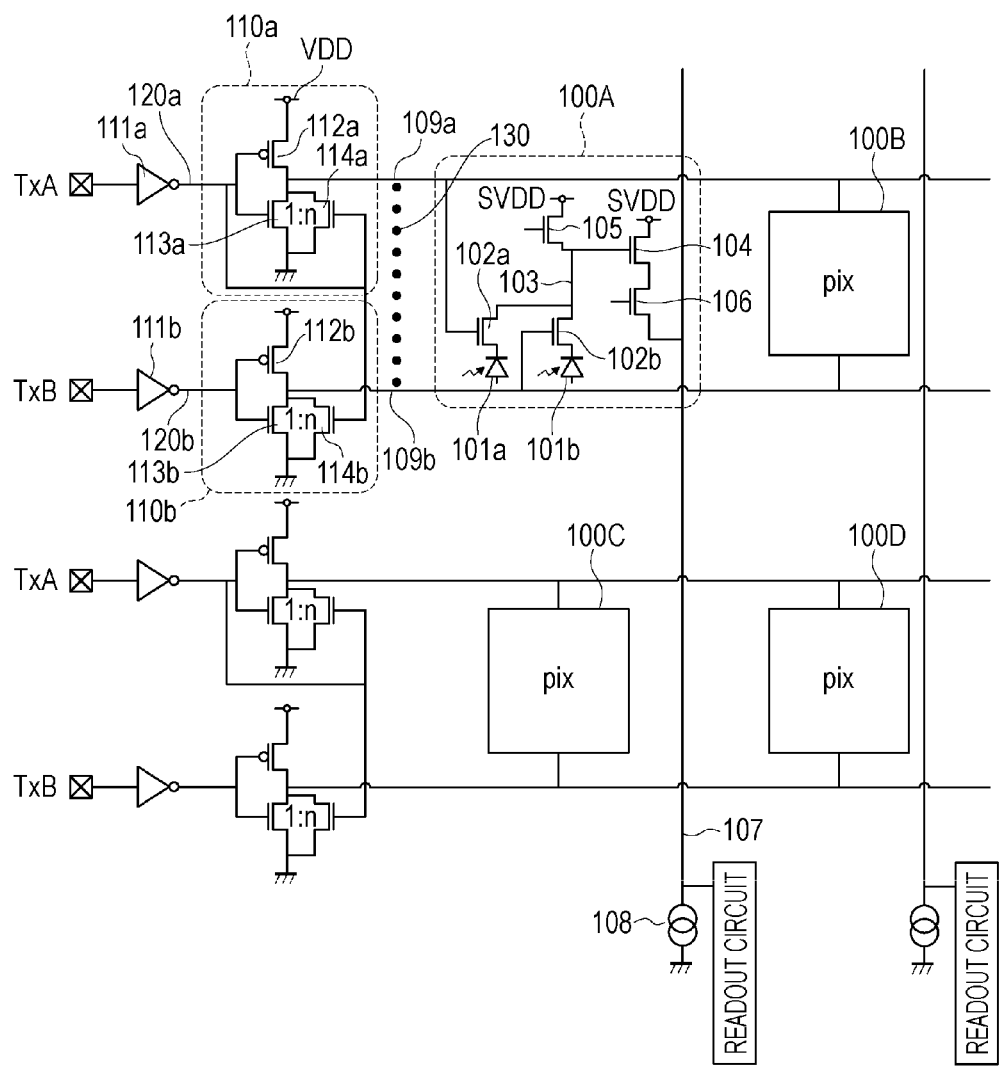
FIG. 2 is a schematic diagram of an image pickup apparatus according to a first exemplary embodiment.

If a load is the same size as the load of the drive line of FIG. 2 and the statically determinate state is established within the same time, as described above, driving performances of the NMOS transistors 302a and 302b each use the combined driving performances of the NMOS transistors 113b and 114b.

When Path 1 and Path 2 are compared with each other, a difference resides in the NMOS transistor 113b and the NMOS transistor 302b. In this case, a ratio of the driving performance of the NMOS transistor 113b to the driving performances of the NMOS transistor 302b is 1:(1+n).

Therefore, the current at the time of the short-circuit also flows approximately at this ratio, and the current on Path 1 can be suppressed to approximately 1/(1+n) as compared with the current on Path 2.

With this configuration, it is possible to reduce influences on the image caused by heat generation and light emission that may occur when the current flows because of the short-circuit.

At the time t2, instantaneously, the NMOS transistors 113b and 114b for decreasing the potential at the first drive line 109a are connected in parallel to have the (1+n)-fold driving performance. For this reason, the driving performances for establishing the statically determinate state are not different in FIG. 2 and FIG. 4. After the statically determinate state is established, the first drive line 109a and the second drive line 109b have the same potential, so that the influence on the operation of the transfer transistor is small even when the short-circuit occurs.

At the time t3, the first drive line 109a has the output (VDD) at the level to turn ON the first transfer transistor 102a again. Since the second drive line 109b also has the output (VDD) at the level to turn ON the second transfer transistor 102b at this time, the short-circuit current hardly flows. The same applies to the time t4.

That is, by using the configuration of FIG. 2, it is possible to suppress the current of the supposed case of the short-circuit to 1/(1+n) without impairing the drivability of the drive unit at a time when the transfer MOS transistor is turned OFF.

In the above, the description has been given while the drivability of the NMOS transistor is used. This can also be defined as a relationship of the output impedance of the second drive unit as described according to the present exemplary embodiment mode.

Specifically, the output impedance of the second drive unit 110b during a period in which the first drive unit 110a supplies the drive pulse for establishing the conductive state and the second drive unit 110b supplies the drive pulse for establishing the non-conductive state is set as Z1. The output impedance of the second drive unit 110b during a period in which the first drive unit 110a supplies the drive pulse for establishing the conductive state and the second drive unit 110b supplies the drive pulse for establishing the conductive state is set as Z2. At this time, since Z1>Z2 is set, it is possible to decrease the current at the time of the short-circuit.

Since the NMOS transistors 113a and 114a of the first drive unit 110a that is driven first among the first drive unit 110a and the second drive unit 110b perform the same operation, the division at 1:n may also be avoided. However, by matching the transistor division of the NMOS transistors 113a and 114a in the first drive unit 110a and the second drive unit 110b, common areas on the layout can be increased. For this reason, for example, variations in manufacturing can be suppressed, and an yield may be improved.

As described above, according to the present exemplary embodiment, without increasing the time for actually setting the potential at the drive line as the desired potential is not increased, the current value flowing in the supposed case of the short-circuit can be decreased. Alternatively, without increasing the time for actually setting the potential at the drive line as the desired potential, a shortest distance between the first and second drive lines can be shortened.

Second Exemplary Embodiment

Figure 5:
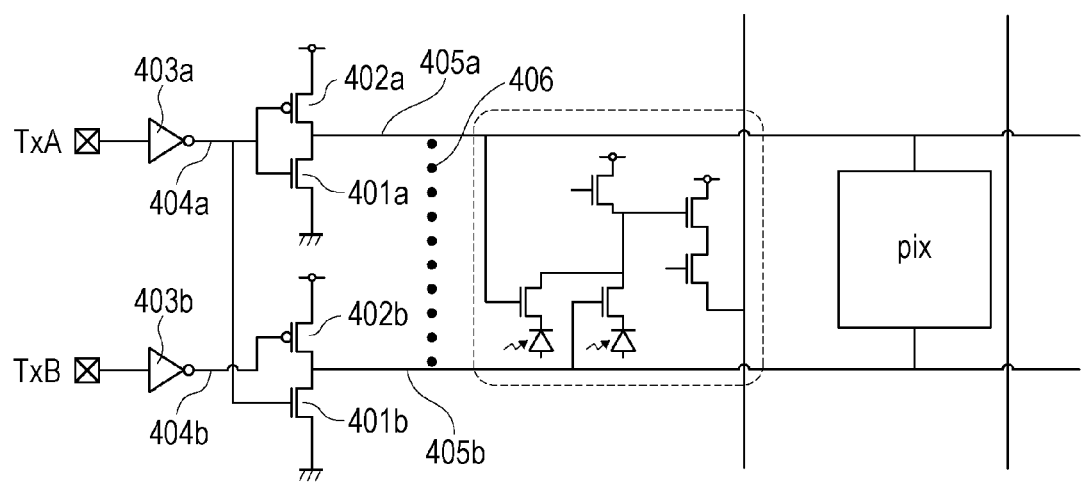
FIG. 5 is a schematic diagram of the image pickup apparatus according to a second exemplary embodiment.

FIG. 5 is a schematic diagram of an image pickup apparatus according to a second exemplary embodiment.

A difference of the present exemplary embodiment from the first exemplary embodiment resides in that a single NMOS transistor is arranged instead of arranging two NMOS transistors connected in parallel in each of the drive units. Furthermore, a difference resides in that an output node 404a of a first buffer 403a is connected to an NMOS transistor 401b arranged in the second drive unit. Furthermore, a difference resides in that an output node 404b of a second buffer 403b is connected to a PMOS transistor 402b but is not connected to a gate of the NMOS transistor 401b.

Figure 6:
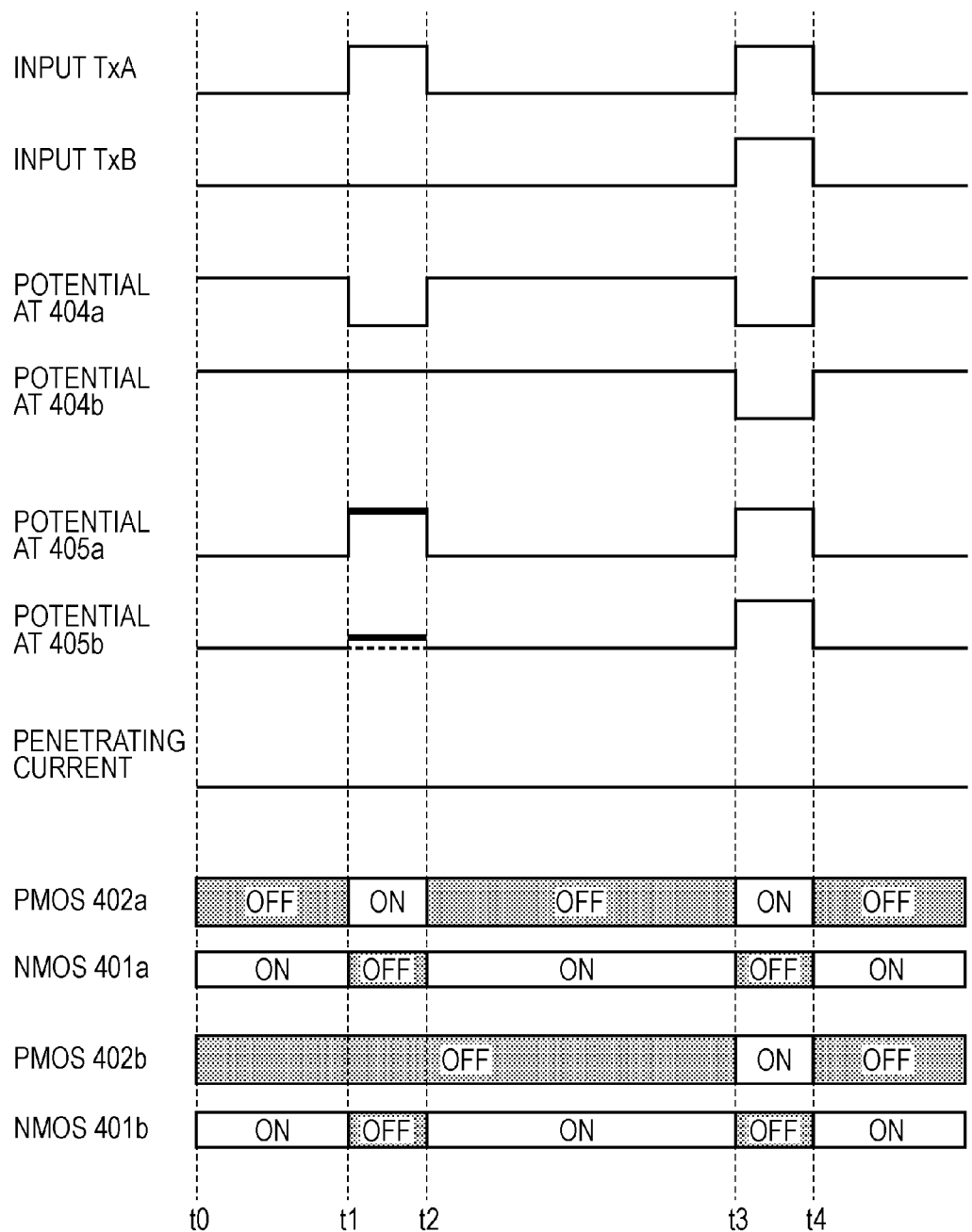
FIG. 6 illustrates an example of a drive pulse chart of the image pickup apparatus according to the second exemplary embodiment.

FIG. 6 illustrates an example of the drive pulse, or a timing chart for a drive pulse, according to the present exemplary embodiment. According to the present exemplary embodiment, a potential at a second drive line 405b is floating during a period between t1 and t2. However, for example, by a parasitic capacitance generated in the second drive line 405b, a potential for turning OFF the second transfer transistor can be held during this period.

According to the present exemplary embodiment, it is possible to decrease the current that may flow when the short-circuit occurs between a first drive line 405a and the second drive line 405b at a dotted line 406 in FIG. 5.

A path of the current that may flow when the short-circuit occurs is Path 3 as follows.

The VDD→the PMOS transistor 402a→the first drive line 405a→the short-circuit location 406→the second drive line 405b (terminating end).

Thus, this is not connected to GND, and a penetrating current hardly flows.

That is, according to the present exemplary embodiment, even if when the short-circuit occurs between the first drive line 405a and the second drive line 405b, an advantage that the penetrating current hardly flows is attained.

Third Exemplary Embodiment

Figure 7:
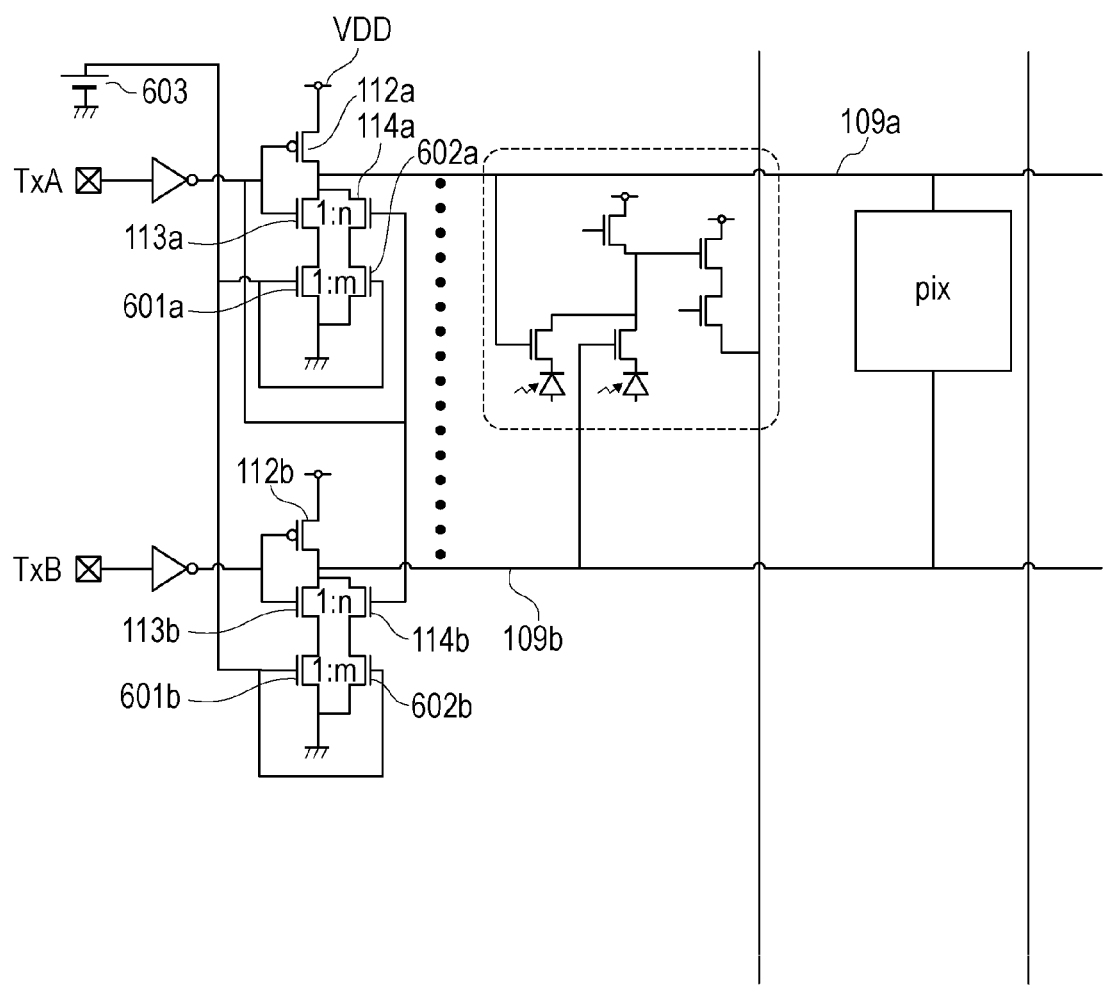
FIG. 7 is a schematic diagram of the image pickup apparatus according to a third exemplary embodiment.
Figure 8:
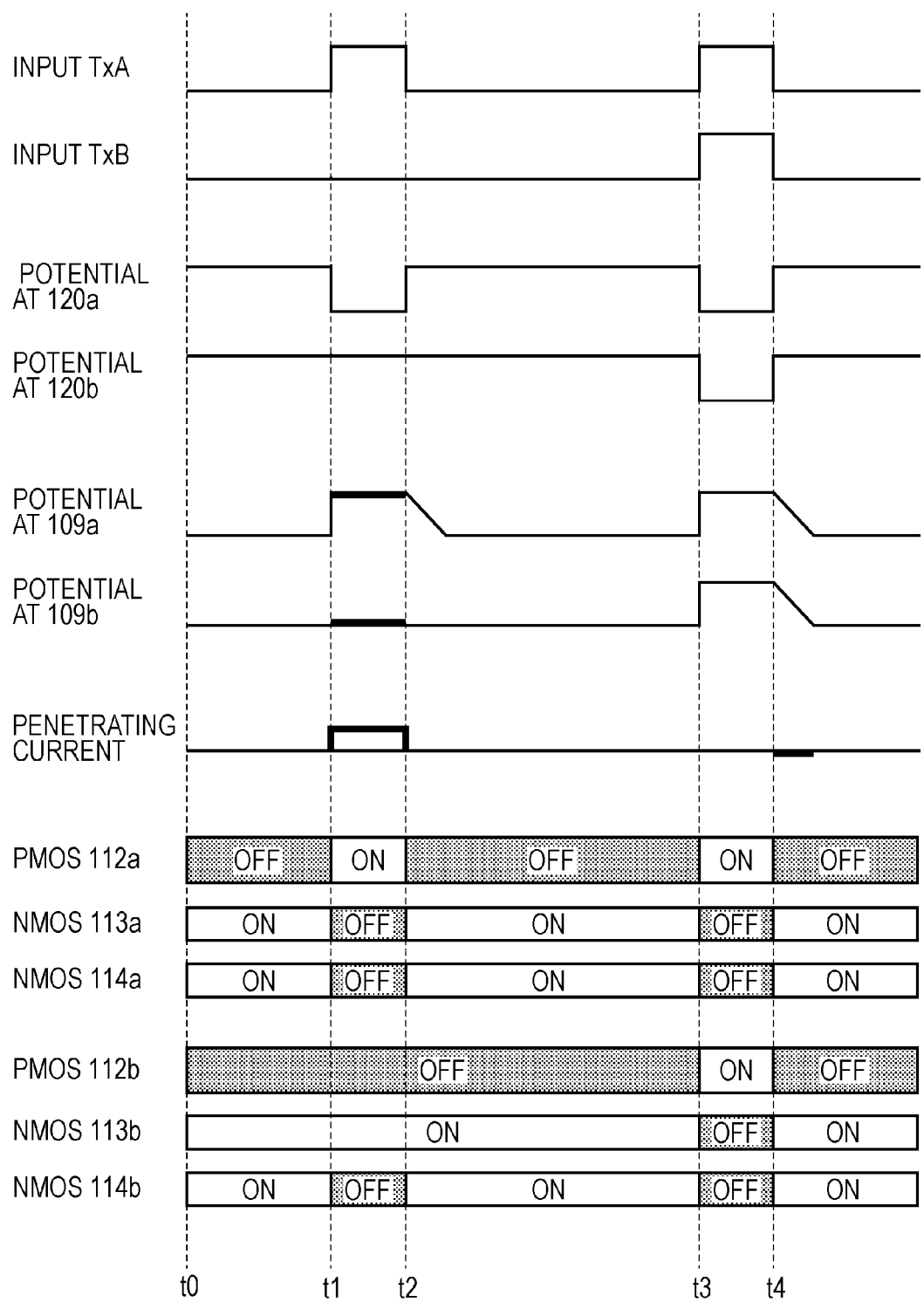
FIG. 8 illustrates an example of a drive pulse chart of the image pickup apparatus according to the third exemplary embodiment.

FIG. 7 is a schematic diagram of an image pickup apparatus according to a third exemplary embodiment, and FIG. 8 illustrates an example of a timing chart of the drive pulse.

A difference of the present exemplary embodiment from the first exemplary embodiment resides in that a MOS transistor 601a (fifth MOS transistor) and a MOS transistor 602a (sixth MOS transistor) are arranged on a source side of the NMOS transistors 113a and 114a (first and second MOS transistors). The fifth MOS transistor and the sixth MOS transistor can function as current sources.

Furthermore, a difference resides in that a MOS transistor 601b (seventh MOS transistor) and a MOS transistor 602b (eighth MOS transistor) are arranged on a source side of the NMOS transistors 113b and 114b (third and fourth MOS transistors). The seventh MOS transistor and the eighth MOS transistor can function as current sources.

A size ratio between the NMOS transistors 113a and 114a may be set to be equal to a size ratio between the MOS transistors 601a and 602a. Similarly, a size ratio between the NMOS transistors 113b and 114b may be set to be equal to a size ratio between the MOS transistors 601b and 602b.

Gates of the MOS transistors 601a and 602a are supplied with a constant voltage from a voltage supply unit 603. Similarly as in the NMOS transistor 113a and the NMOS transistor 114a, the MOS transistors 601a and 602a may be constituted at the size ratio at 1:n. Alternatively, the MOS transistors 601a and 602a may also be constituted at a size ratio different from the size ratio between the NMOS transistor 113a and the NMOS transistor 114a.

With the arrangement of the MOS transistors 601a and 601b, the changes in the potential at the first drive line 109a and the potential at the second drive line 109b can be set to be moderate as illustrated in FIG. 8. Along with this, the change in the gate voltage is set to be moderate when the first transfer transistor 102a and the second transfer transistor 102b are transited from ON to OFF. According to this, it is possible to improve the change transfer characteristic from the photoelectric conversion unit.

In addition, the present exemplary embodiment exerts the effect when the short-circuit occurs between the first drive line 109a and the second drive line 109b as indicated by the dotted line 130 in FIG. 7.

A path in this case is Path 4 as follows.
The VDD→the PMOS transistor 112a→the first drive line 109a→the short-circuit location 130→the second drive line 109b→the NMOS transistor 113b→the MOS transistor 601b→the GND.

The current value flowing through this path can be limited by the MOS transistor 601b.

Therefore, by setting the size ratio between the MOS transistors 601b and 602b to be still larger (m is increased in 1:m), it is possible to further suppress the short-circuit current.

In the meantime, in the operation for setting the changes in the potential at the first drive line 109a and the potential at the second drive line 109b to be moderate as illustrated in FIG. 8, this does not depend on the size ratio since the charge of the drive line is pulled out by using the MOS transistor functioning as the current source. Therefore, with regard to the value of 1:m, m is preferably set to be larger. From the viewpoint of an actual layout relationship, 2<m<50 is preferably set. 10<m<30 is more preferably set.

Fourth Exemplary Embodiment

Figure 9:
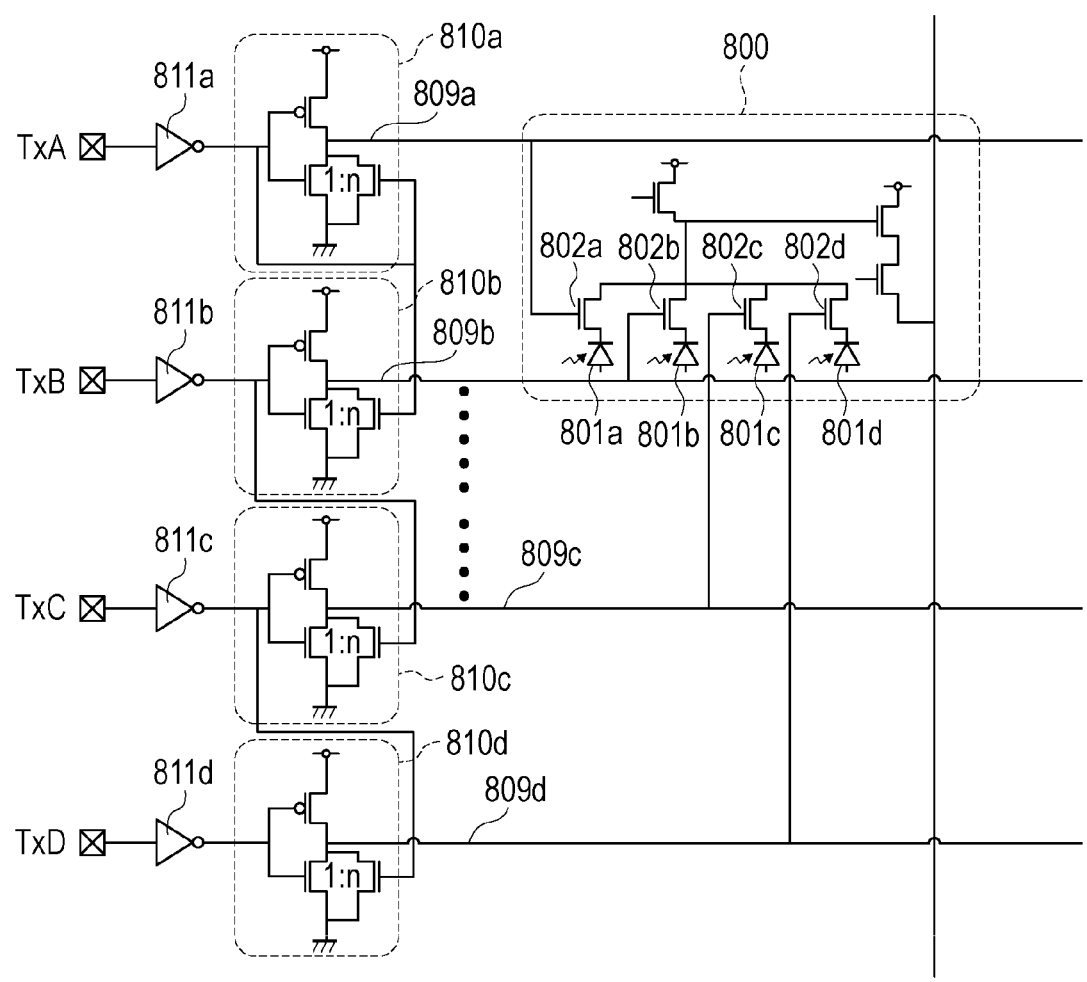
FIG. 9 is a schematic diagram of the image pickup apparatus according to a fourth exemplary embodiment.

FIG. 9 is a schematic diagram of an image pickup apparatus according to a fourth exemplary embodiment.

A difference of the present exemplary embodiment from the first exemplary embodiment resides in that four photoelectric conversion units are arranged in a pixel unit 800 whereas two photoelectric conversion units are arranged according to the first exemplary embodiment. The four photoelectric conversion units correspond to photodiodes 801a, 801b, 801c, and 801d. In addition, transfer transistors 802a, 802b, 802c, and 802d configured to transfer changes of the respective photodiodes are arranged while corresponding to the respective photodiodes 801a, 801b, 801c, and 801d. Furthermore, respectively corresponding drive lines 809a, 809b, 809c, and 809d are arranged.

The drive lines 809a, 809b, 809c, and 809d are connected to respectively corresponding drive units 810a, 810b, 810c, and 810d. The drive units 810a, 810b, 810c, and 810d are respectively connected to buffers 811a, 811b, 811c, and 811d to which control pulses T×A, T×B, T×C, and T×D are input.

An output node of the buffer 811a is connected to gates of NMOS transistors of the drive unit 810b which are connected in parallel. Similarly, an output node of the buffer 811b is connected to gates of NMOS transistors of the drive unit 810c which are connected in parallel. Furthermore, an output node of the buffer 811c is connected to gates of NMOS transistors of the drive unit 810d which are connected in parallel.

FIG. 10 illustrates an example of the drive pulse, or a timing chart for a drive pulse, of the image pickup apparatus of FIG. 9. As illustrated in FIG. 9, even if a short-circuit location 830 is generated, similarly as in the above-described exemplary embodiments, it is possible to suppress the current at the time of the short-circuit to 1/(1+n) without impairing the drivability for turning OFF the transfer MOS transistor.

According to the present exemplary embodiment, the example has been described in which the four photoelectric conversion units are arranged in the pixel unit, but the division number is not limited to four, and the same applies to cases where the division is performed at an arbitrary number.

In this manner, as the number of photoelectric conversion units is increased, the number of drive lines is increased, so that the present exemplary embodiment is more preferably adopted.

The disclosure has been described above by way of the specific exemplary embodiments. However, the disclosure is not limited to the respective exemplary embodiments, and modifications and combinations can appropriately be made without departing from the idea of the disclosure. For example, the example has been described in which the signal for the image pickup is obtained by the addition in the amplification element of the pixel, but the addition or averaging may externally be performed to obtain the signal for the image pickup.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-100249, filed May 10, 2013, which is hereby incorporated by reference herein in its entirety.

What is claimed is:

1. An image pickup apparatus comprising:
a plurality of photoelectric conversion units including a first photoelectric conversion unit and a second photoelectric conversion unit adjacent to the first photoelectric conversion unit;
a first transfer transistor configured to transfer charge of the first photoelectric conversion unit;
a second transfer transistor configured to transfer charge of the second photoelectric conversion unit;
a first drive line that supplies a drive pulse to the first transfer transistor;
a second drive line that supplies a drive pulse to the second transfer transistor;
a first drive unit configured to drive the first drive line; and
a second drive unit configured to drive the second drive line,
wherein an output impedance of the second drive unit during a period in which the first drive unit supplies the first transfer transistor with a drive pulse for setting the first transfer transistor to be in a conductive state and also the second drive unit supplies the second transfer transistor with a drive pulse for setting the second transfer transistor to be in a non-conductive state is higher than an output impedance of the second drive unit during a period in which the first drive line supplies the first transfer transistor with the drive pulse for setting the first transfer transistor to be in the conductive state and also the second drive line supplies the second transfer transistor with a drive pulse for setting the second transfer transistor to be in the conductive state.

2. The image pickup apparatus according to claim 1,
wherein the first drive unit includes
a first switch that supplies a voltage corresponding to the drive pulse for setting the first transfer transistor to be in the conductive state, and
a second switch that supplies a voltage corresponding to the drive pulse for setting the first transfer transistor to be in the non-conductive state,
wherein the second drive unit includes
a third switch that supplies a voltage corresponding to the drive pulse for setting the second transfer transistor to be in the non-conductive state, and
wherein control nodes of the first and second switches and a control node of the third switch are a common node.

3. The image pickup apparatus according to claim 2, wherein the first switch is constituted by a PMOS transistor, and the second and third switches are constituted by NMOS transistors.

4. The image pickup apparatus according to claim 2,
wherein the second drive unit includes
a fourth switch connected in parallel to the third switch, and
wherein a control node of the fourth switch and the control node of the third switch are nodes that can electrically be separated from each other.

5. The image pickup apparatus according to claim 2,
wherein the third and fourth switches are constituted by MOS transistors, and
wherein a driving performance of the MOS transistor that constitutes the third switch is higher than a driving performance of the MOS transistor that constitutes the fourth switch.

6. The image pickup apparatus according to claim 5,
wherein when a channel length and a channel width of the MOS transistor that constitutes the third switch are respectively set as L1 and W1, and a channel length and a channel width of the MOS transistor that constitutes the fourth switch are respectively set as L2 and W2, a relationship of W1/L1>W2/L2 is established.

7. The image pickup apparatus according to claim 2,
wherein the first drive unit includes a sixth switch connected in parallel to the second switch, and
wherein a control node of the sixth switch and the control nodes of the first, second, and third switches are a common node.

8. The image pickup apparatus according to claim 1,
wherein the second drive unit includes
a fifth switch that supplies a voltage corresponding to the drive pulse for setting the second transfer transistor to be in the conductive state,
wherein control nodes of the first, second, and third switches are a common node, and
wherein a control node of the fifth switch is a node that can electrically be separated from the common node.

9. The image pickup apparatus according to claim 1,
wherein the first drive unit includes
a current source that flows a current when a voltage corresponding to the drive pulse for setting the first transfer transistor to be in the non-conductive state is supplied to the first transfer transistor, and
wherein the second drive unit includes
a current source that flows a current when a voltage corresponding to the drive pulse for setting the second transfer transistor to be in the non-conductive state is supplied to the second transfer transistor.

10. The image pickup apparatus according to claim 1,
wherein the first drive unit includes
a first MOS transistor functioning as a second switch that supplies a voltage corresponding to the drive pulse for setting the first transfer transistor to be in the non-conductive state and a second MOS transistor functioning as a sixth switch connected in parallel to the second switch,
wherein the second drive unit includes
a third MOS transistor functioning as a third switch that supplies a voltage corresponding to the drive pulse for setting the second transfer transistor to be in the non-conductive state, and a fourth MOS transistor functioning as a fourth switch connected in parallel to the third switch,
wherein the image pickup apparatus further includes
a fifth MOS transistor that is arranged on a source side of the first MOS transistor and functions as a current source, a sixth MOS transistor that is arranged on a source side of the second MOS transistor and functions as a current source, a seventh MOS transistor that is arranged on a source side of the third MOS transistor and functions as a current source, and an eighth MOS transistor that is arranged on a source side of the fourth MOS transistor and functions as a current source,
wherein a size ratio between the first MOS transistor and the second MOS transistor is equal to a size ratio between the fifth MOS transistor and the sixth MOS transistor, and
wherein a size ratio between the third MOS transistor and the fourth MOS transistor is equal to a size ratio between the seventh MOS transistor and the eighth MOS transistor.

11. The image pickup apparatus according to claim 1,
wherein charge transferred by the first transfer transistor and charge transferred by the second transfer transistor are transferred to an input node of a common amplification element.

12. The image pickup apparatus according to claim 11,
wherein charge generated in the first photoelectric conversion unit and charge generated in the second photoelectric conversion unit are added in the common amplification element.

13. The image pickup apparatus according to claim 12,
wherein after the charge generated in the first photoelectric conversion unit is transferred to the common amplification element by at least partially overlapping a period in which the drive pulse for setting the first transfer transistor to be in the conductive state is supplied to the first drive line with a period in which the drive pulse for setting the second transfer transistor to be in the non-conductive state is supplied to the second drive line,
the charge generated in the first photoelectric conversion unit and the charge generated in the second photoelectric conversion unit are transferred to the common amplification element and added by at least partially overlapping a period in which the drive pulse for setting the first transfer transistor to be in the conductive state is supplied to the first drive line with a period in which the drive pulse for setting the second transfer transistor to be in the conductive state is supplied to the second drive line.

14. The image pickup apparatus according to claim 1,
wherein the first drive unit is driven by a first buffer, the second drive unit is driven by a second buffer.

15. The image pickup apparatus according to claim 1,
wherein light focused by a single micro lens enters the first photoelectric conversion unit and the second photoelectric conversion unit.

16. The image pickup apparatus according to claim 1,
wherein a focus detection operation on an image pickup surface is performed by using a signal generated in the first photoelectric conversion unit and a signal generated in the second photoelectric conversion unit, and
wherein an image pickup operation is performed by adding or averaging the signal generated in the first photoelectric conversion unit and the signal generated in the second photoelectric conversion unit.

17. An image pickup apparatus comprising:
a plurality of photoelectric conversion units including a first photoelectric conversion unit and a second photoelectric conversion unit adjacent to the first photoelectric conversion unit;
a first transfer transistor configured to transfer charge of the first photoelectric conversion unit;
a second transfer transistor configured to transfer charge of the second photoelectric conversion unit;
a first drive line that supplies a drive pulse to the first transfer transistor;
a second drive line that supplies a drive pulse to the second transfer transistor;
a first drive unit configured to drive the first drive line; and
a second drive unit configured to drive the second drive line,
wherein the first drive unit includes
a first switch that supplies a voltage corresponding to the drive pulse for setting the first transfer transistor to be in the conductive state, a second switch that supplies a voltage corresponding to the drive pulse for setting the first transfer transistor to be in the non-conductive state, and a sixth switch connected in parallel with the second switch, wherein the second drive unit includes
a fifth switch that supplies a voltage corresponding to the drive pulse for setting the second transfer transistor to be in the conductive state, a fourth switch that supplies a voltage corresponding to the drive pulse for setting the second transfer transistor to be in the non-conductive state, and a third switch connected in parallel with the fourth switch,
wherein control nodes that control the first, second, third, and sixth switches are a common node, and
wherein a control of the fourth switch is electrically independent from the common node.

18. The image pickup apparatus according to claim 17,
wherein the first drive unit further includes
a current source that flows a current when the voltage corresponding to the drive pulse for setting the first transfer transistor to be in the non-conductive state is supplied to the first transfer transistor, and
wherein the second drive unit includes
a current source that flows a current when the voltage corresponding to the drive pulse for setting the second transfer transistor to be in the non-conductive state is supplied to the second transfer transistor.

19. The image pickup apparatus according to claim 17,
wherein light focused by a single micro lens enters the first photoelectric conversion unit and the second photoelectric conversion unit.

20. The image pickup apparatus according to claim 17,
wherein a focus detection operation on an image pickup surface is performed by using a signal generated in the first photoelectric conversion unit and a signal generated in the second photoelectric conversion unit, and
wherein an image pickup operation is performed by adding or averaging the signal generated in the first photoelectric conversion unit and the signal generated in the second photoelectric conversion unit.

* * * * *